(12) United States Patent
Baba et al.

(10) Patent No.: US 7,274,296 B2
(45) Date of Patent: Sep. 25, 2007

(54) RFID TAG

(75) Inventors: Shunji Baba, Kawasaki (JP); Naoki Ishikawa, Kawasaki (JP); Hidehiko Kira, Kawasaki (JP); Hiroshi Kobayashi, Kawasaki (JP); Shigeru Hashimoto, Inagi (JP); Yoshiyasu Sugimura, Inagi (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 164 days.

(21) Appl. No.: 11/062,483

(22) Filed: Feb. 23, 2005

(65) Prior Publication Data

US 2006/0097877 A1    May 11, 2006

(30) Foreign Application Priority Data

Nov. 9, 2004   (JP) ............................. 2004-325394

(51) Int. Cl.
*G08B 13/14*   (2006.01)
(52) U.S. Cl. ............................ 340/572.4; 340/572.1; 340/572.7; 340/572.8
(58) Field of Classification Search ............ 340/572.4, 340/572.7, 572.1, 572.8, 568.1; 235/492
See application file for complete search history.

(56) References Cited

U.S. PATENT DOCUMENTS

| 6,050,622 | A | * | 4/2000 | Gustafson | 292/307 R |
| 6,421,013 | B1 | | 7/2002 | Chung | |
| 2003/0075608 | A1 | * | 4/2003 | Atherton | 235/492 |
| 2004/0066296 | A1 | * | 4/2004 | Atherton | 340/572.1 |

FOREIGN PATENT DOCUMENTS

JP    2003-524811    8/2003

* cited by examiner

*Primary Examiner*—Toan N. Pham
(74) *Attorney, Agent, or Firm*—Westerman, Hattori, Daniels & Adrian, LLP.

(57) ABSTRACT

The present invention provides an RFID tag that is very effective in preventing fraudulent uses. The RFID tag includes a base, an antenna pattern provided on the base, a breakdown pattern provided on the base, a circuit chip connected to both the antenna pattern and the breakdown pattern, and a cover that is bonded to the base in a strippable condition so as to cover the antenna pattern, the breakdown pattern and the circuit chip and is caused to come off together with all or a part of the breakdown pattern during stripping from the base. The breakdown pattern is transparent, or the cover conceals a remaining part of the breakdown pattern, or the breakdown pattern has a specific part that produces predetermined electrical properties and the cover conceals the specific part.

7 Claims, 9 Drawing Sheets

RFID TAG

BACKGROUND OF THE INVENTION

1. Field of the Invention

The present invention relates to an RFID (Radio Frequency Identification) tag that performs information exchange with external equipment in a noncontact manner. Incidentally, among those skilled in the art related to the technical field of the present application, the "RFID tag" used in the specification of the present application may sometimes be called an "inlay for RFID tag" by regarding the "RFID tag" as an internal component member (inlay) for "RFID tag." Or alternatively, in some cases, this "RFID tag" may be referred to as "a radio IC tag." Also, a noncontact type IC card is included in this "RFID tag."

2. Description of the Related Art

In recent years, there have been proposed various RFID tags that perform information exchange with external equipment represented by a reader/writer in a noncontact manner by use of radio waves. As one kind of this RFID tag, there has been proposed an RFID tag in which an antenna pattern for radio communication and an IC chip are mounted on a base sheet made of plastics or paper. A conceived mode of using an RFID tag of this type is such that the RFID tag is stuck to an article and the like and performs the identification of the article by exchanging information on the article with external equipment.

In this mode of using an RFID tag of this type, there is excepted a fraudulent use in which an RFID tag stuck to an article is stripped off from the article and then this RFID tag is stuck to another article in order to mislead external equipment in the identification of the article, whereby, for example, an expensive article is obtained as if it were an inexpensive one. Therefore, a technique for preventing such fraudulent uses is demanded.

Against this background, there have been proposed techniques for making communication impossible by causing an antenna pattern to be broken down during the stripping of an RFID tag (refer to the U.S. Patent Laid-Open No. 2003/075608, the U.S. Pat. No. 6,421,013 and the National Publication of International Patent Application No. 2003-524811, for example).

FIGS. 1(A) and 1(B) are a front view and a side view, respectively, of an RFID tag of conventional technique in a condition before stripping.

An RFID tag 1 shown in FIGS. 1(A) and 1(B) is constituted by an antenna pattern 12 provided on a base sheet 13, an IC chip 11 connected to the antenna pattern 12 via a bump 16, and a cover sheet 14 bonded to the base sheet with an adhesive 15 so as to cover the antenna pattern 12 and the IC chip 11.

This RFID tag 1 is used, with the base sheet 13 side thereof stuck to an article, and the adhesive force of the adhesive 15 is weaker than the adhesive force with which the base sheet 13 side of the RFID tag 1 is bonded to the article. For this reason, when the RFID tag 1 is stripped off by a person who attempts fraudulent uses, the cover sheet 14 comes off from the base sheet 13.

Also, the antenna pattern 12 has portions that are weak in adhesion to the base sheet 13 from place to place.

FIGS. 2(A) and 2(B) are a front view and a side view, respectively, of an RFID tag of conventional technique in a condition after stripping.

When the cover sheet 14 shown in FIGS. 1(A) and 1(B) is stripped off from the base sheet 13, the antenna pattern 12 comes off together with the cover sheet 14 in a portion 12a with weak adhesion to the base sheet 13, whereby the antenna pattern 12 loses the function as a communication antenna and communication becomes impossible.

As a technique for preventing fraudulent uses, there is also proposed a technique in which a dedicated pattern that is broken down during stripping is provided in the RFID tag in addition to the antenna pattern and a breakdown of the dedicated pattern is detected by use of an IC chip.

FIGS. 3(A) and 3(B) are a view of another RFID tag of conventional technique in a condition, respectively, before and after stripping.

An RFID tag 2 shown in FIGS. 3(A) and 3(B) is provided with an antenna pattern 22, an IC chip 21 connected to the antenna pattern 22, and a breakdown pattern 23 that is cause to conduct by a conductive ink 24, and as with the RFID tag 1 shown in FIGS. 1(A) and 1(B), the RFID tag 2 is also provided with a base sheet and a cover sheet, which are omitted in the figures.

Also in the case of this RFID tag 2, if the RFID tag 2 is stripped off by a person who attempts fraudulent uses, the cover sheet comes off from the base sheet. And in this RFID tag 2, the conductive ink 24 spatters while the cover sheet is coming off, thereby bringing the breakdown pattern 23 into an insulating condition, and the IC chip 21 detects this insulating condition in the breakdown pattern 23. Also, the breakdown is visually ascertained from the conductive ink 24 that has spattered.

In the case of the RFID tag 2 shown in FIGS. 3(A) and 3(B), the antenna pattern 22 and its communication function are maintained even when the cover sheet comes off, and the antenna pattern 22 informs external equipment of the stripping of the RFID tag 2 during communication with the external equipment.

However, in conventional techniques as described above, the fact that due to the stripping of an RFID tag, part of the tag is broken down and the place where the tag is broken down are clear to the person who attempts fraudulent uses. Therefore, this gives the person who attempts fraudulent uses a motivation and an opportunity for repairing the broken place, posing the problem that the prevention of fraudulent uses is insufficient.

SUMMARY OF THE INVENTION

In view of the circumstances described above, the present invention provides an RFID tag that is every effective in preventing fraudulent uses.

The present invention provides, as the first RFID tag of the invention, an RFID tag that comprises: a base; a first pattern that is provided on the base and forms an antenna for communication; a second pattern that is provided on the base and is formed from a transparent conductor; a circuit chip that is electrically connected to the first pattern and the second pattern and performs radio communication via the antenna and detects a breakdown of the second pattern; and a cover that is bonded to the base in a strippable condition so as to cover the first pattern, the second pattern and the circuit chip and is caused to come off together with all or a part of the second pattern during stripping from the base.

According to the first RFID tag of the invention, because the second pattern is transparent, the person who has stripped off an RFID tag in order to attempt fraudulent uses does not become aware that part of the second pattern has been broken down or does not become aware of the broken place. For this reason, no motivation for repairing the broken place or the like arises and the breakdown of the second pattern is positively detected by the circuit chip. Thus, the first RFID tag of the invention is very effective in preventing fraudulent uses.

The second RFID tag of the invention comprises: a base; a first pattern that is provided on the base and forms an antenna for communication; a second pattern that is provided on the base and is formed from a conductor; a circuit chip that is electrically connected to the first pattern and the second pattern and performs radio communication via the antenna and detects a breakdown of the second pattern; and a cover that is bonded to the base in a strippable condition so as to cover and conceal the first pattern, the second pattern and the circuit chip and is caused to come off separately as a concealing part and an exposure part during stripping from the base and to come off while bringing a portion of the second pattern corresponding to the exposure part.

According to the second RFID tag of the invention, the part of the second pattern that remains on the base after the stripping of the cover is concealed by the concealing part and a broken place of the second pattern becomes unclear. For this reason, as with the first RFID tag, this does not give a motivation or the like for repairing the broken place to a person who attempts fraudulent uses. Thus, the second RFID tag of the invention is very effective in preventing fraudulent uses.

The third RFID tag of the invention comprises: a base; a first pattern that is provided on the base and forms an antenna for communication; a second pattern that is provided on the base and has a specific part in which a conductor is arranged so as to produce prescribed electrical properties; a circuit chip that is electrically connected to the first pattern and the second pattern and performs radio communication via the antenna and detects electrical properties generated by the presence of the specific part in the second pattern; and a cover that is bonded to the base in a strippable condition so as to cover the first pattern, the second pattern and the circuit chip and conceal at least the specific part of the second pattern and is caused to come off together with the specific part during stripping from the base.

According to the third RFID tag of the invention, the specific part of the second pattern is concealed by the cover and this specific part is caused to come off during stripping. For this reason, the construction of the specific part is prevented from becoming known to human beings. When a complicated construction is adopted in the specific part, it becomes impossible for a person who attempts fraudulent uses to repair the specific part.

It is preferred that in the second and third RFID tags of the invention, the second pattern be formed from a transparent conductor.

By adopting the second pattern formed from a transparent conductor in the second and third RFID tags of the invention, it is ensured that the effect of the first RFID tag of the invention is exerted in a synergistic manner and it becomes more impossible to recognize the breakdown of the second pattern. Therefore, the effect on the prevention of fraudulent uses is also improved.

Also, it is preferred that in the second and third RFID tags of the invention, the cover have, on the side thereof in contact with the second pattern, the same color as the color of the conductor of the second pattern.

The fact that the conductor and cover of the second pattern have the same color also makes it difficult to recognize the presence of the conductor and it becomes more impossible to recognize the breakdown of the second pattern. Therefore, the effect on the prevention of fraudulent uses is also improved.

As described above, the RFID tags of the invention are very effective in preventing fraudulent uses.

DETAILED DESCRIPTION OF THE INVENTION

Figure 1A:
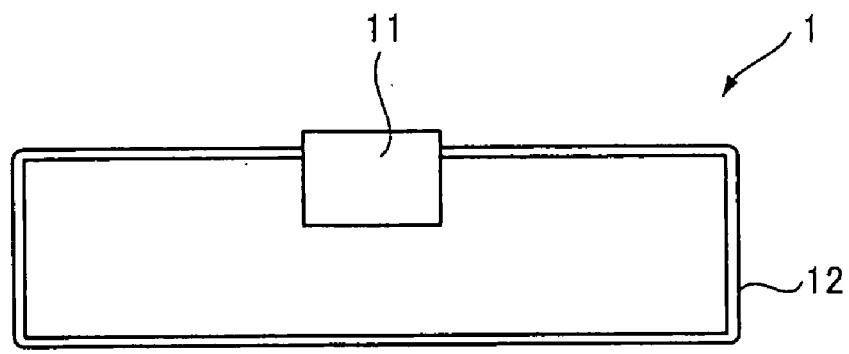
FIGS. 1(A) and 1(B) are a front view and a side view, respectively, of an RFID tag of conventional technique in a condition before stripping.
Figure 1B:
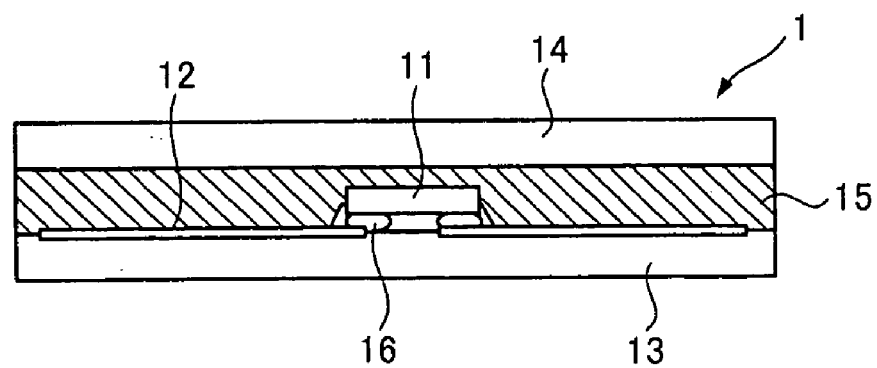
Figure 2A:
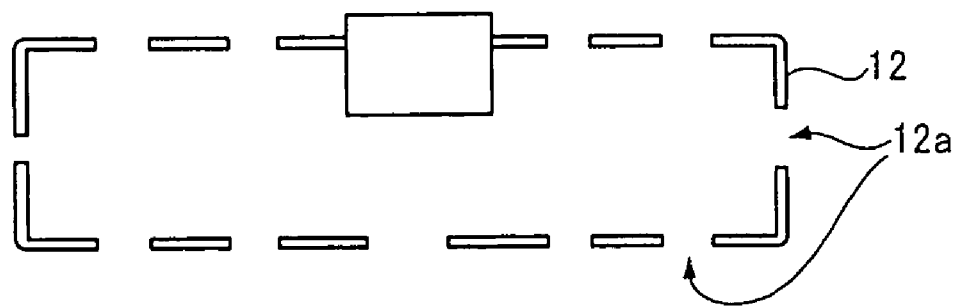
FIGS. 2(A) and 2(B) are a front view and a side view, respectively, of an RFID tag of conventional technique in a condition after tripping.
Figure 2B:
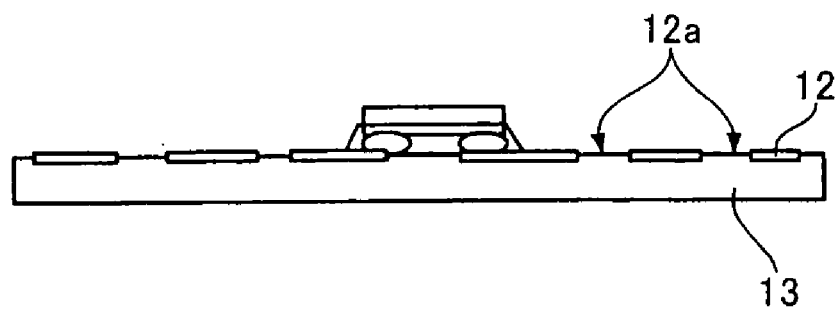
Figure 3A:
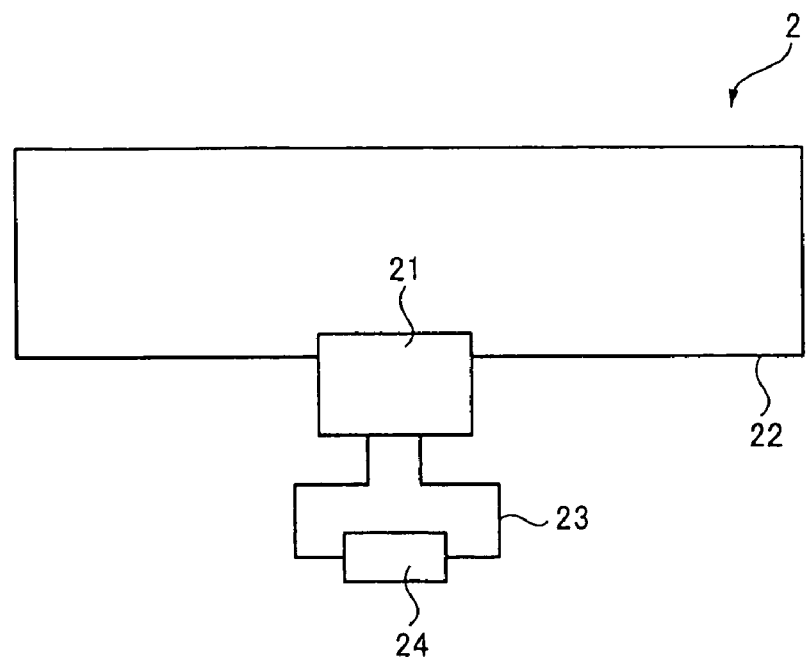
FIGS. 3(A) and 3(B) are a view of another RFID tag of conventional technique in a condition, respectively, before and after stripping.
Figure 3B:
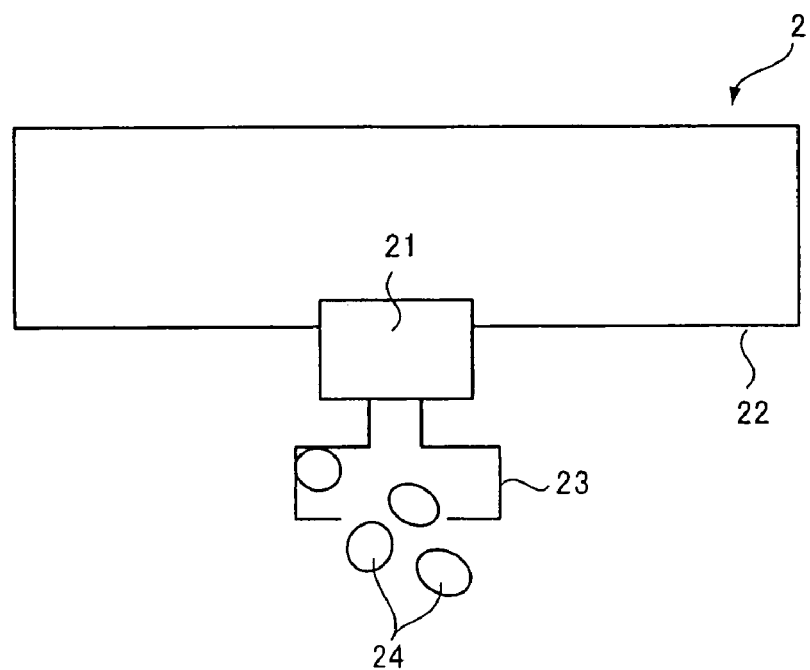

Embodiments of the present invention will be described below by referring to the drawings.

Figures 4A, 4B:
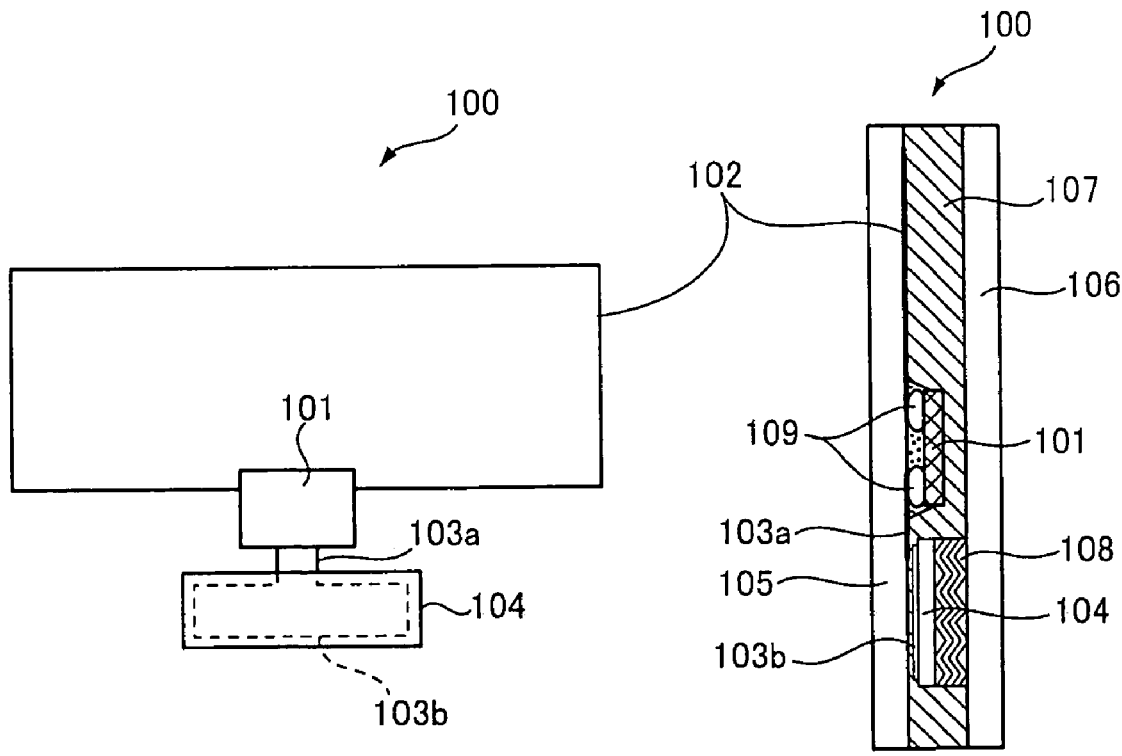
FIGS. 4(A) and 4(B) are a front view and a side view, respectively, of an RFID tag of the first embodiment of the invention.

FIGS. 4(A) and 4(B) are a front view and a side view, respectively, of an RFID tag of the first embodiment of the invention.

An RFID tag 100 of the first embodiment is provided with a base sheet 105 made of PET, a copper antenna pattern 102 provided on the base sheet 105, a breakdown pattern constituted by a copper wire part 103a and a transparent ITO (Indium Tin Oxide) part 103b, and an IC chip 101 electrically connected to the antenna pattern 102 via a bump 109. The ITO part 103b of the breakdown pattern is formed on a sub sheet 104 made of PET, connected to the copper wire part 103a with a conductive adhesive and electrically connected to the IC chip 101 via the copper part 103a and the bump 109. The IC chip 101 performs communication with external equipment represented by a reader/writer via the antenna pattern 102. The IC chip 101 has also the function of detecting the presence or absence of the ITO part 103b in the breakdown pattern. This RFID tag 100 is also provided with a PET cover sheet 106 that is bonded to the base sheet 105 with an adhesive 107 so as to cover the antenna pattern 102, the IC chip 101, etc., and this cover sheet 106 and the sub sheet 104 are bonded together with a strong adhesive 108.

In this first embodiment, the base sheet 105 corresponds to an example of the base of the invention, the antenna pattern 102 corresponds to an example of the first pattern of the invention, the ITO part 103b of the breakdown pattern corresponds to an example of the second pattern of the invention, the IC chip 101 corresponds to an example of the circuit chip of the invention, and the cover sheet 106 corresponds to an example of the cover of the invention.

Externally to the eyes, in the RFID tag 100 constructed in this manner, the IC chip 101, the antenna pattern 102 and the copper wire part 103a are recognized and the presence of the transparent ITO part 103b is not recognized.

This RFID tag 100 is used, with the base sheet 105 side thereof stuck to an article, and the adhesive force of the adhesive 107 is weaker than the adhesive force with which the base sheet 105 side of the RFID tag 100 is bonded to the article. For this reason, when the RFID tag 100 is stripped off by a person who attempts fraudulent uses, the cover sheet 106 comes off from the base sheet 105. Furthermore, the sub sheet 104 is bonded to the cover sheet 106 with the strong adhesive 108. Therefore, while the cover sheet 106 is coming off from the base sheet 105, the sub sheet 104 comes off from the base sheet 105 together with the ITO part 103b following the cover sheet 106.

Figure 5A:
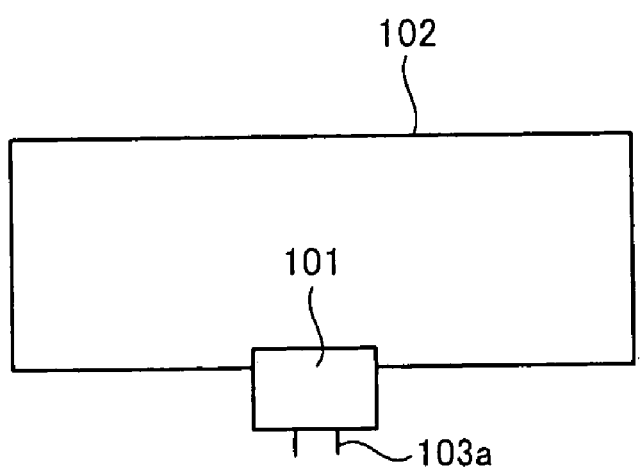
FIGS. 5(A) and 5(B) are a front view and a side view, respectively, of an RFID tag of the first embodiment of the invention in a condition after stripping.
Figure 5B:
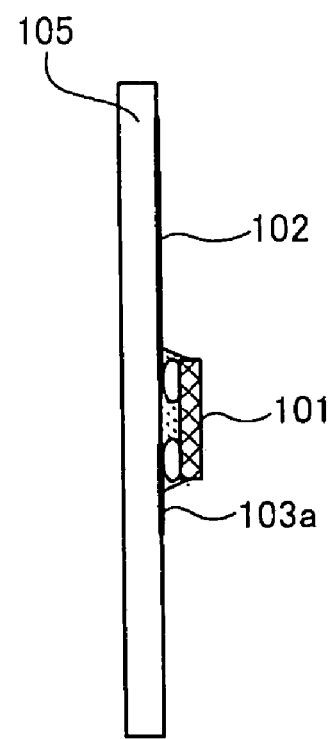

FIGS. 5(A) and 5(B) are a front view and a side view, respectively, of an RFID tag of the first embodiment of the invention in a condition after stripping.

When the cover sheet comes off, the IC chip 101, the antenna pattern 102 and the copper wire part 103a remain on the base sheet 105, and the IC chip 101 detects the absence of the ITO part 103b shown in FIGS. 4(A) and 4(B) and gives external equipment an alarm via the antenna pattern 102 to the effect that the cover sheet has come off.

Externally to the eyes, the condition of the cover sheet that has come off is the same as the condition of the cover sheet before coming off as viewed to the eyes. Therefore, a person who attempts fraudulent uses cannot recognize the absence of the ITO part 103b and hence this person does not think of the correction of the missing portion. Therefore, an attempt to perform fraudulent uses is positively found out by the above-described alarm and positive prevention of fraudulent uses is realized. Furthermore, because the ITO part 103b can be formed in a fine pattern of 30 μm or so and the visibility of the ITO part 103b formed in such a fine pattern is very low, the prevention of fraudulent uses becomes more positive.

Figure 6A:
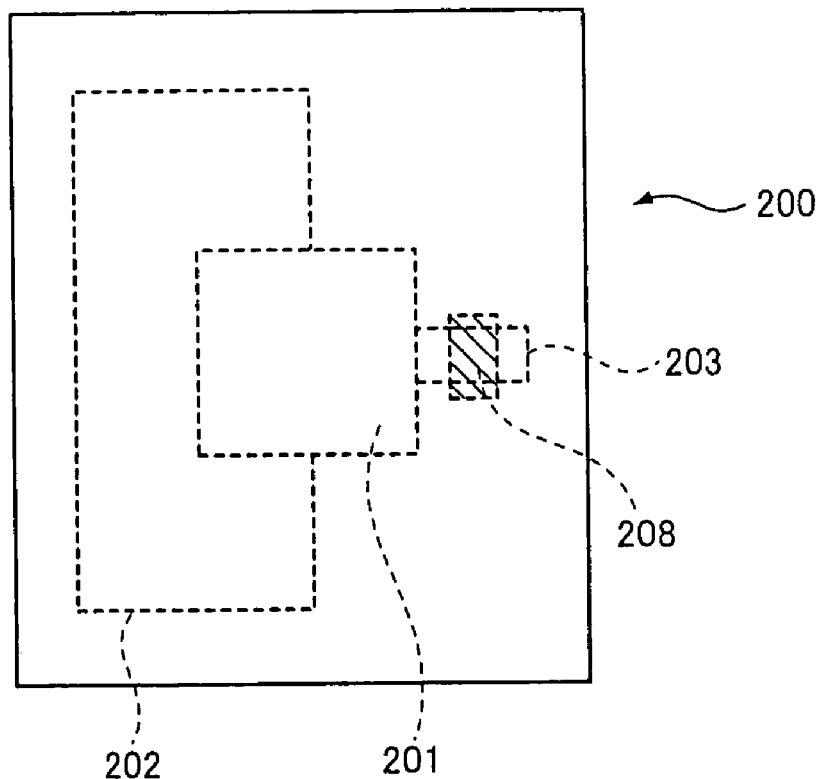
FIGS. 6(A) and 6(B) are a front view and a side view, respectively, of an RFID tag of the second embodiment of the invention.
Figure 6B:
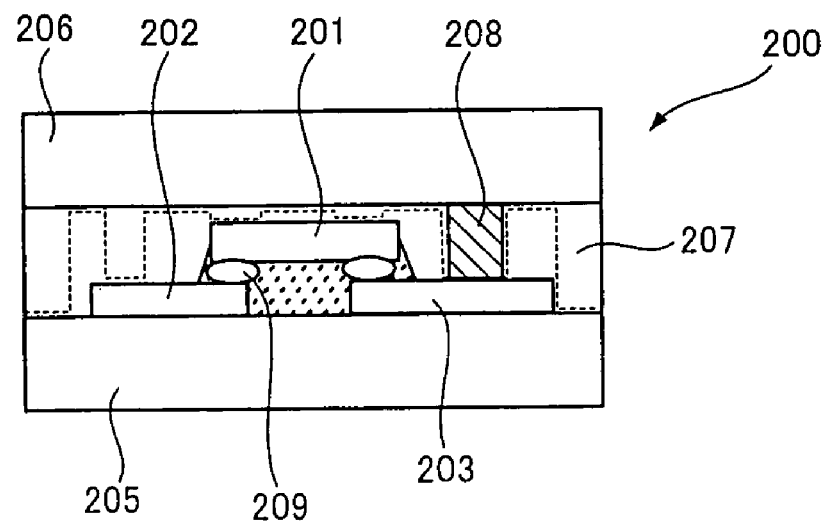

FIGS. 6(A) and 6(B) are a front view and a side view, respectively, of an RFID tag of the second embodiment of the invention.

An RFID tag 200 of the second embodiment is constituted by a base sheet 205 made of PET, an antenna pattern 202 provided on the base sheet 205, a breakdown pattern 203 made of a silver paste, an IC chip 201 electrically connected to both the antenna pattern 202 and the breakout pattern 203 via a bump 209, a concealing layer 207 that covers and conceals the IC chip 201, the antenna pattern 202 and the breakdown pattern 203 and is formed from an opaque ink having the color of silver, and a transparent cover sheet 206 bonded to the base sheet 205 via the concealing layer 207.

In this second embodiment, the base sheet 205 corresponds to an example of the base of the invention, the antenna pattern 202 corresponds to an example of the first pattern of the invention, the breakdown pattern 203 corresponds to an example of the second pattern of the invention, the IC chip 201 corresponds to an example of the circuit chip of the invention, and the cover sheet 206 and the concealing layer 207 constitute an example of the cover of the invention.

The cover sheet 206 and the concealing layer 207 have the same construction as what is called a forgery-preventive label, and the concealing layer 207 is so constructed as to be easily separated into a part on the cover sheet 206 side and a part on the base sheet 205 side, as shown by a dotted line in FIG. 6(B). However, a strong adhesive 208 is also embedded in the concealing layer 207 and a portion of the breakdown pattern 203 is strongly bonded to the cover sheet 206.

Also in the second embodiment shown in FIGS. 6(A) and 6(B), the RFID tag 200 is used, with the base sheet 205 side thereof stuck to an article. And the concealing layer 207 is separated into a part on the cover sheet 206 side and a part on the base sheet 205 side with a force that is weaker than the adhesive force with which the base sheet 205 side is bonded to the article.

Figure 7A:
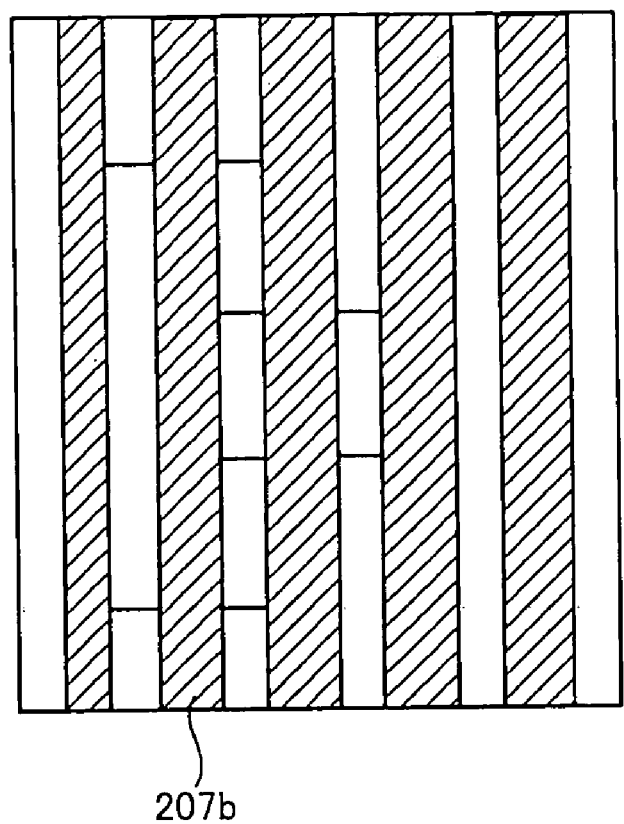
FIGS. 7(A) and 7(B) are a front view and a side view, respectively, of an RFID tag of the second embodiment of the invention in a condition after stripping.
Figure 7B:
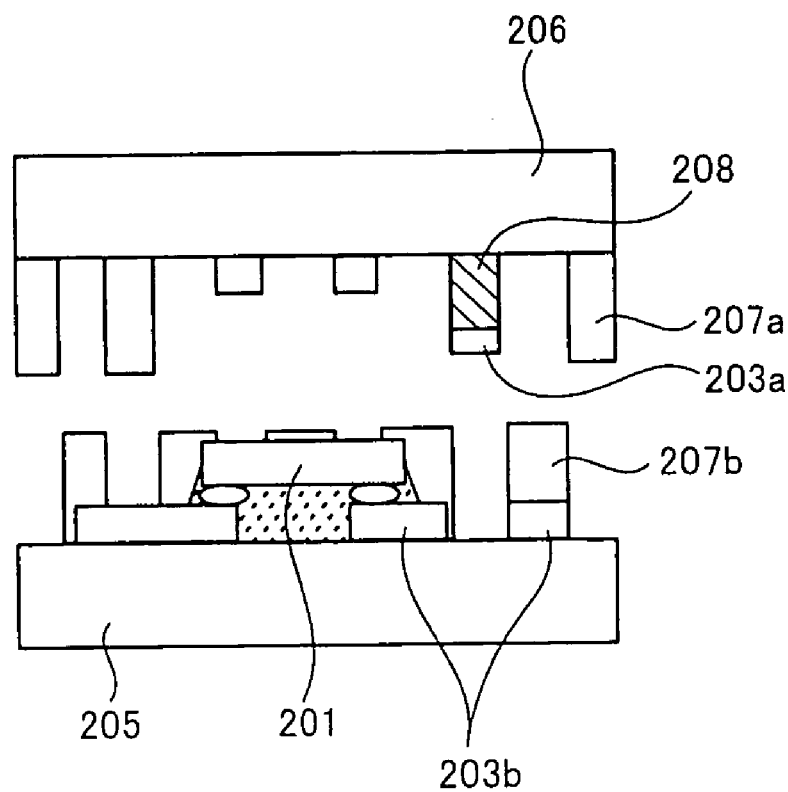

FIGS. 7(A) and 7(B) are a front view and a side view, respectively, of an RFID tag of the second embodiment of the invention in a condition after stripping.

When the cover sheet 206 is caused to come off, an exposure part 207a of the concealing layer is caused to come off together with the cover sheet 206 and a concealing part 207b of the concealing layer remains on the base sheet 205 side. As a result of this, on the front side of the RFID tag side there appears a marking from which the fact that the tag has been stripped off can be ascertained at a glance. A breakdown part 203a of the breakdown pattern is caused to come off from the base sheet 205 together with the cover sheet 206 due to the presence of the strong adhesive 208, and the breakdown pattern comes to an insulating condition. As with the first embodiment, the insulating condition of the breakdown pattern is detected by the IC chip 201 and the detection is communicated to an external equipment.

Because the remaining part 203b of the breakdown pattern that remains on the base sheet 205 side is concealed by the concealing part 207b of the concealing layer and the breakdown part 203a adhering to the cover sheet 206 side has the color of silver, which is the same cooler as the concealing layer, the fact that the breakdown pattern has been broken down, the broken part and the like are not recognized. For this reason, also in the second embodiment, a motivation for repairing does not arise and positive prevention of fraudulent uses is realized.

Incidentally, a form in which the breakdown pattern of this second embodiment is made of ITO as with the first embodiment is also useful. In a form in which the breakdown pattern of this second embodiment is made of ITO like this, the color of the ink of the concealing layer can be freely selected and, therefore, it is possible to increase the color variations of the tag and the like. As an inexpensive form of RFID tag it is possible to prepare the breakdown pattern from copper. In such an inexpensive form, there is a possibility that a breakdown part adhering to the cover sheet side might be noticed. However, it is rare that one takes the trouble to check the rear side of a cover sheet that has come off, and hence even this form is sufficiently effective in preventing fraudulent uses.

Figure 8:
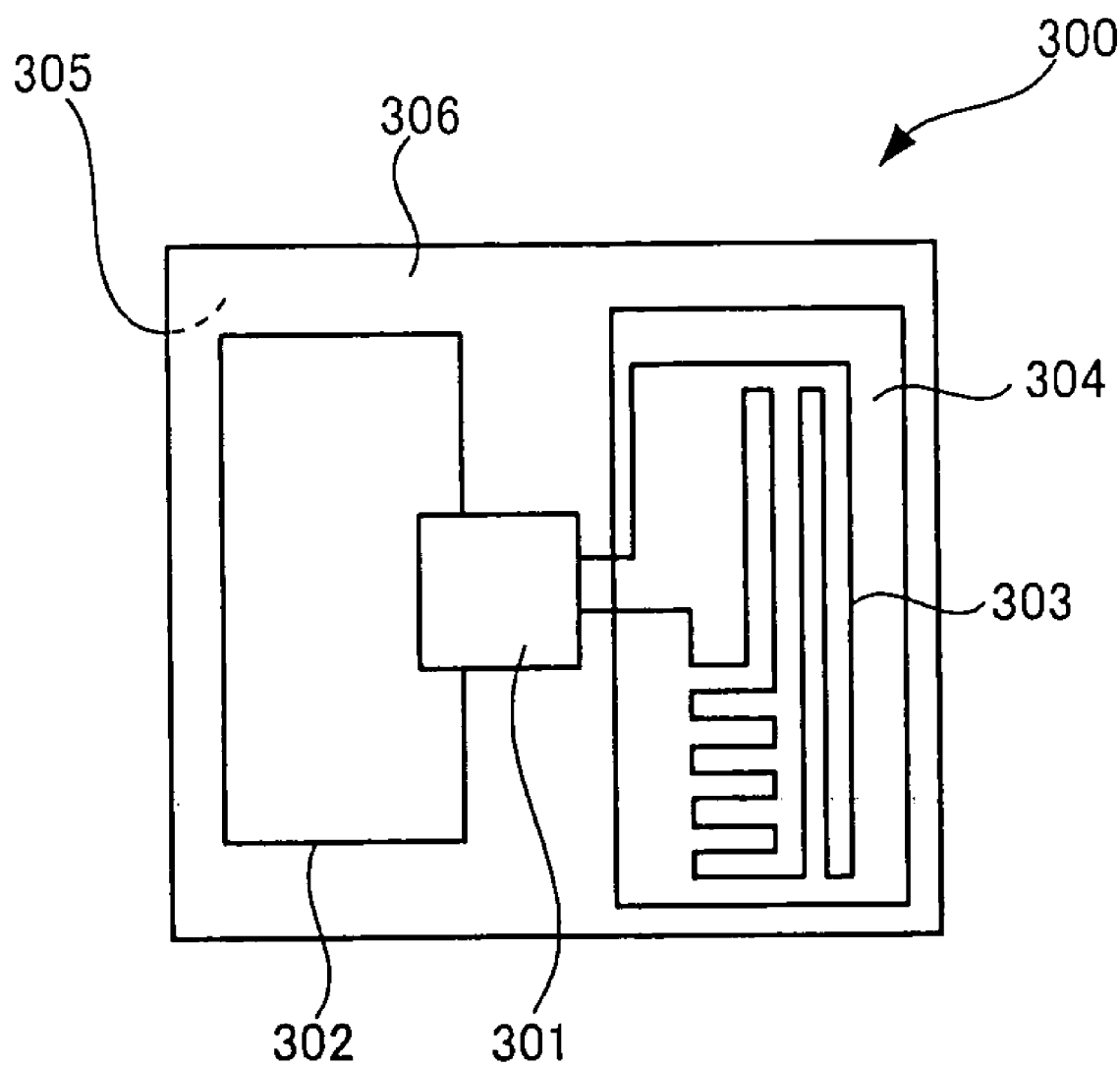
FIG. 8 is a drawing of an RFID tag of the third embodiment of the invention.

FIG. 8 is a drawing of an RFID tag of the third embodiment of the invention.

An RFID tag 300 of the third embodiment is provided with a base sheet 305, an antenna pattern 302 provided on the base sheet 305, a breakdown pattern 303 made of a silver paste, an IC chip 301 connected to both the antenna pattern 302 and the breakout pattern 303, and a cover sheet 306 that covers the antenna pattern 302, the breakdown pattern 303 and the IC chip 301, and this cover sheet 306 has a concealing part 304 having the color of silver that conceals the breakdown pattern 303.

In this third embodiment, the base sheet 305 corresponds to an example of the base of the invention, the antenna pattern 302 corresponds to an example of the first pattern of the invention, the breakdown pattern 303 corresponds to an example of the second pattern of the invention, the IC chip 301 corresponds to an example of the circuit chip of the invention, and the cover sheet 306 corresponds to an example of the cover of the invention.

In this third embodiment, a long pattern of complicated shape is used as the breakdown pattern 303 and a prescribed value of resistance Ri is produced. The IC chip 301 monitors resistance values in the breakdown pattern 303.

Also the RFID tag 300 of this third embodiment is used, with the base sheet 305 stuck to an article in the same manner as in the first embodiment and the like, and the cover sheet 306 is bonded to the base sheet 305 with an adhesive force weaker than the adhesive force with which the base sheet 305 is bonded to the article. And when a force that works so as to strip off the RFID tag 300 from the article is applied, the cover sheet comes off from the base sheet 305. The concealing part 304 of the cover sheet 306 is strongly bonded to the breakdown pattern 303, and when the cover sheet 306 comes off from the base sheet 305, the breakdown pattern 303 comes off from the base sheet 305 while being stuck to the concealing part 304.

Figure 9A:
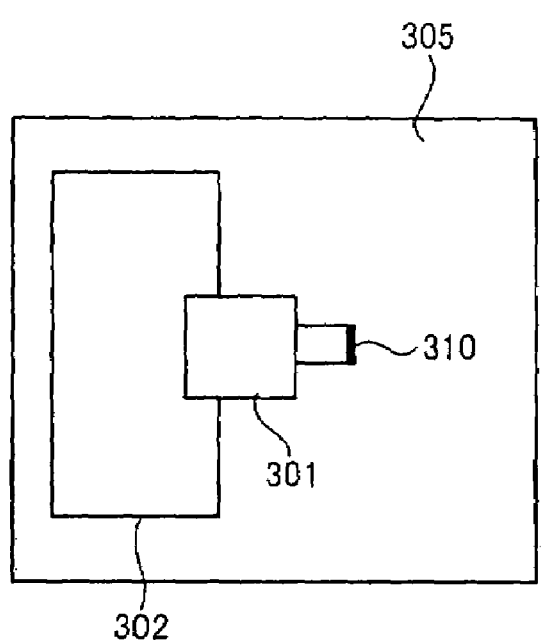
FIGS. 9(A) and 9(B) are each a drawing of an RFID tag of the third embodiment of the invention in a condition after stripping.
Figure 9B:
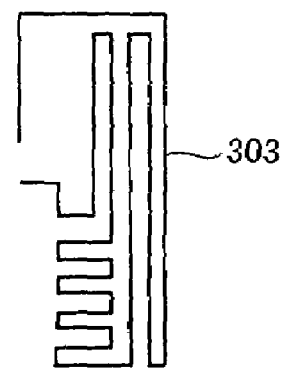

FIGS. 9(A) and 9(B) are each a drawing of an RFID tag of the third embodiment of the invention in a condition after stripping.

As shown in FIG. 9(A), the antenna pattern 302 and the IC chip 301 remain on the base sheet 305 after stripping, and the breakdown pattern 303 is caused to come off as shown in FIG. 9(B). For this reason, the IC chip 301 detects a substantial increase in the resistance value, confirms an insulating condition and can inform external equipment of the insulating condition. Even when a person who attempts fraudulent uses has formed a repaired path 310 by use of copper tape or solder, the IC chip 301 readily detects the repair and can inform the repair to external equipment, because the resistance value Rr of the repaired path 310 is much smaller than the resistance value Ri of the original breakdown pattern 303. The breakdown pattern 303 is long and has a complicated shape. In addition, because the breakdown pattern 303 is formed from a silver paste and adheres to the concealing part having the color of silver, the visibility is low. For this reason, a person who attempts fraudulent uses cannot reproduce the essential resistance value Ri and positive prevention of fraudulent uses is realized. A form in which the breakdown pattern 303 is made of ITO and a form in which the breakdown pattern 303 is formed in a fine pattern of ITO are also useful.

Incidentally, although in the above descriptions, a cover sheet made of PET and a base sheet made of PET are mentioned as an example of the cover and base of the invention, the cover and base of the invention may be formed from materials other than PET and may have a shape other than the shape of a sheet.

Also, although in the above descriptions, a copper antenna pattern is mentioned as an example of the first pattern of the invention, the first pattern of the invention may be formed from a silver paste.

Furthermore, although in the above descriptions, examples in which the base sheet is bonded to an article are shown, the cover side of the RFID tag according to the invention may be bonded to the article.

What is claimed is:

1. An RFID tag, comprising:
    a base;
    a first pattern that is provided on the base and forms an antenna for communication;
    a second pattern that is provided on the base and is formed from a transparent conductor;
    a circuit chip that is electrically connected to the first pattern and the second pattern and performs radio communication via the antenna and detects a breakdown of the second pattern; and
    a cover that is bonded to the base in a strippable condition so as to cover the first pattern, the second pattern and the circuit chip and is caused to come off together with all or a part of the second pattern during stripping from the base.

2. An RFID tag, comprising:
    a base;
    a first pattern that is provided on the base and forms an antenna for communication;
    second pattern that is provided on the base and is formed from a conductor;
    a circuit chip that is electrically connected to the first pattern and the second pattern and performs radio communication via the antenna and detects a breakdown of the second pattern; and
    a cover that is bonded to the base in a strippable condition so as to cover and conceal the first pattern, the second pattern and the circuit chip and is caused to separate into a concealing part and an exposure part during stripping from the base wherein said concealing part remains with said base and said exposure part is removed with a portion of the second pattern corresponding to the exposure part.

3. The RFID tag according to claim 2, wherein the second pattern is formed from a transparent conductor.

4. The RFID tag according to claim 2, wherein the cover has, on the side thereof in contact with the second pattern, the same color as the conductor of the color of the second pattern.

5. An RFID tag, comprising:
    a base;
    a first pattern that is provided on the base and forms an antenna for communication;
    a second pattern that is provided on the base and has a specific part in which a conductor is arranged so as to produce prescribed electrical properties;
    a circuit chip that is electrically connected to the first pattern and the second pattern and performs radio communication via the antenna and detects electrical properties generated by the presence of the specific part in the second pattern; and
    a cover that is bonded to the base in a strippable condition so as to cover the first pattern, the second pattern and the circuit chip and conceal at least the specific part of the second pattern and is caused to come off together with the specific part during stripping from the base.

6. The RFID tag according to claim 5, wherein the second pattern is formed from a transparent conductor.

7. The RFID tag according to claim 5, wherein the cover has, on the side thereof in contact with the second pattern, the same color as the conductor of the color of the second pattern.

* * * * *